(12) United States Patent
Lim et al.

(10) Patent No.: US 9,859,355 B2
(45) Date of Patent: Jan. 2, 2018

(54) ORGANIC LIGHTING EMITTING DISPLAY DEVICE INCLUDING LIGHT ABSORBING LAYER AND METHOD FOR MANUFACTURING SAME

(71) Applicant: LG Display Co., Ltd., Seoul (KR)

(72) Inventors: Jungshik Lim, Paju-si (KR); EunMi Jo, Goyang-si (KR); SungKyung Youn, Suwon-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/132,864

(22) Filed: Apr. 19, 2016

(65) Prior Publication Data

US 2016/0233291 A1    Aug. 11, 2016

Related U.S. Application Data

(62) Division of application No. 14/567,719, filed on Dec. 11, 2014, now Pat. No. 9,397,122.

(30) Foreign Application Priority Data

Aug. 14, 2014 (KR) ........................ 10-2014-0105778

(51) Int. Cl.
*H01L 21/00* (2006.01)
*H01L 27/32* (2006.01)
*H01L 27/12* (2006.01)
*H01L 27/15* (2006.01)
*H01L 33/00* (2010.01)
(Continued)

(52) U.S. Cl.
CPC ........ *H01L 27/3276* (2013.01); *H01L 27/124* (2013.01); *H01L 27/1259* (2013.01); *H01L 27/156* (2013.01); *H01L 27/3244* (2013.01); *H01L 27/3272* (2013.01); *H01L 29/78633* (2013.01); *H01L 33/005* (2013.01); *H01L 51/5284* (2013.01); *H01L 27/322* (2013.01);
(Continued)

(58) Field of Classification Search
CPC ............. H01L 27/3244; H01L 27/3272; H01L 29/78633; H01L 51/5284
USPC ..................... 257/72, 88, 98; 438/22, 29, 34
See application file for complete search history.

(56) References Cited

U.S. PATENT DOCUMENTS 8,324,612 B2    12/2012   Lee et al.
2002/0014627 A1  2/2002   Sato
(Continued)

FOREIGN PATENT DOCUMENTS

CN          1413069 A       4/2003

*Primary Examiner* — Matthew E Warren
(74) *Attorney, Agent, or Firm* — Birch, Stewart, Kolasch & Birch, LLP

(57) ABSTRACT

A method of preparing a display device including a plurality of pixels where a plurality of gate lines cross a plurality of data lines, respectively, each of the pixels including a thin film transistor (TFT) region and a display region, the method can include: forming a thin film transistor (TFT) in the TFT region; and forming a light emitting element for displaying images based on signals from the TFT in the display region, in which a metallic layer is disposed in the TFT region for electrical connection of the TFT; and a light absorbing layer configured to absorb at least part of light propagating toward the metallic layer is disposed on the metallic layer between the metallic layer and one of a gate insulating layer, an active layer, an interlayer dielectric layer and a substrate.

20 Claims, 12 Drawing Sheets

(51) Int. Cl.
*H01L 29/786* (2006.01)
*H01L 51/52* (2006.01)
(52) U.S. Cl.
CPC ............. *H01L 2227/323* (2013.01); *H01L 2933/0066* (2013.01)

(56) References Cited

U.S. PATENT DOCUMENTS

| | | | |
|---|---|---|---|
| 2004/0132293 A1* | 7/2004 | Takayama | H01L 21/268 438/689 |
| 2008/0124850 A1 | 5/2008 | Takayama et al. | |
| 2013/0187164 A1* | 7/2013 | Oshima | H01L 29/78693 257/59 |

\* cited by examiner

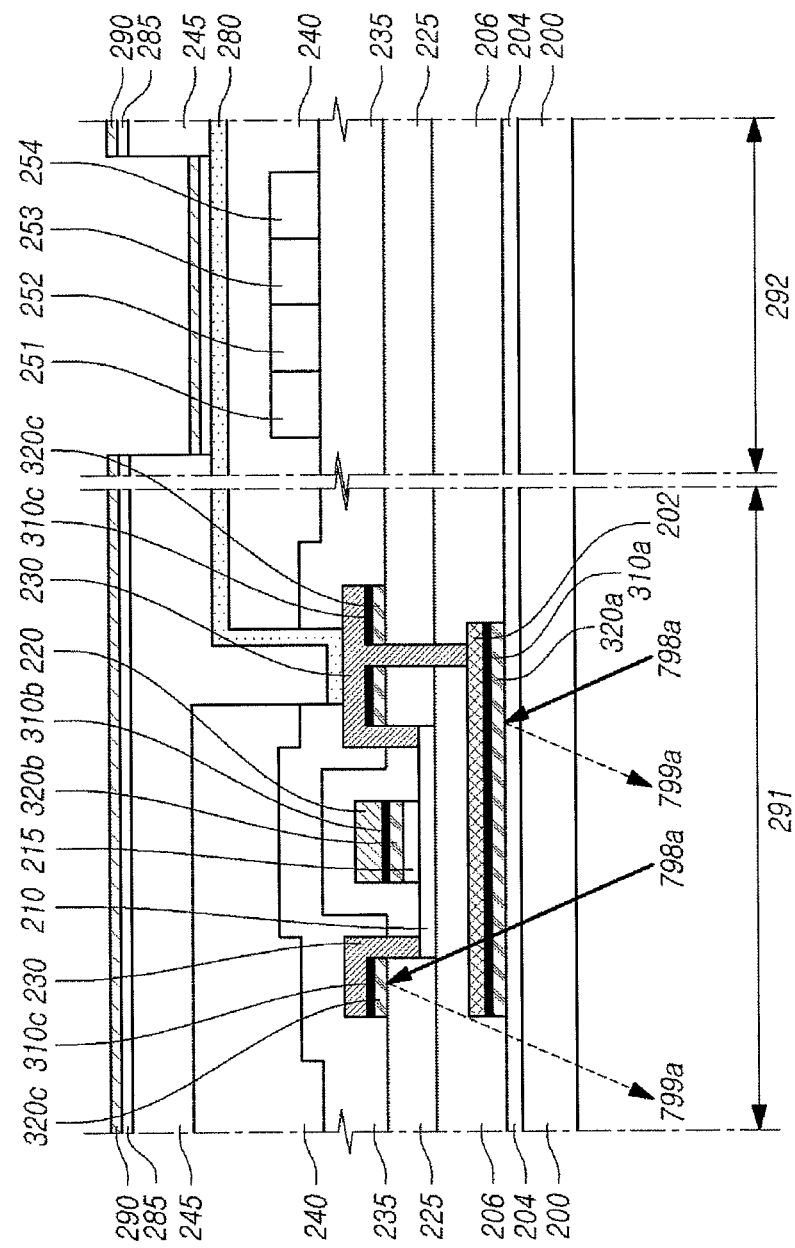

ORGANIC LIGHTING EMITTING DISPLAY DEVICE INCLUDING LIGHT ABSORBING LAYER AND METHOD FOR MANUFACTURING SAME

CROSS-REFERENCE TO RELATED APPLICATION

This application is a Divisional of co-pending U.S. application Ser. No. 14/567,719, filed on Dec. 11, 2014, which claims priority from and the benefit under 35 U.S.C. §119(a) of Korean Patent Application No. 10-2014-0105778, filed on Aug. 14, 2014. All of these applications are hereby incorporated by reference for all purposes as if fully set forth herein.

BACKGROUND OF THE INVENTION

Field of the Invention

The present invention relates to an organic light emitting display for displaying an image and having a light absorbing layer combined therein, and a method of manufacturing the same.

Description of the Related Art

As the information society develops, display devices for displaying an image are being increasingly required in various forms, and in recent years, various display devices such as Liquid Crystal Displays (LCDs), Plasma Display Panels (PDPs), and Organic Light Emitting Display Devices (OLEDs) have been utilized. Each of such various display devices includes a display panel proper for the display device.

The display panel included in such a display device may be one of multiple display panels made from one substrate. That is, according to various processing procedures, elements constituting pixels, signal lines, and power lines are first formed in units of display panels in one substrate, and the substrate is then cut using a scribing equipment in units of the display panels, so as to produce a plurality of display panels.

Light incident to a display device from the outside thereof is reflected by elements, such as wire lines, constituting the display device, and then escapes the display device. This outgoing reflected light may overlap with an image output by the display device to degrade the quality of the image. Therefore, a technology for reducing the reflection of incident light is necessary.

SUMMARY OF THE INVENTION

Accordingly, embodiments of the present application are directed to a display device and a preparing method thereof that substantially obviate one or more of problems due to the limitations and disadvantages of the related art. According to one aspect of the embodiments, a display device includes a plurality of pixels where a plurality of gate lines cross a plurality of data lines, respectively, each of the pixels including a thin film transistor (TFT) region and a display region; a TFT formed in the TFT region; light emitting elements formed in the display region for displaying images based on signals from the TFT; a metallic layer disposed in the TFT region for electrical connection of the TFT; and a light absorbing layer disposed on the metallic layer and configured to absorb at least part of light propagating toward the metallic layer.

A method of preparing a display device according to another aspect of the present embodiments includes: forming a thin film transistor (TFT) in a TFT region; and forming a light emitting element for displaying images based on signals from the TFT in the display region, wherein a metallic layer is disposed in the TFT region for electrical connection of the TFT, and wherein a light absorbing layer configured to absorb at least part of light propagating toward the metallic layer is disposed on the metallic layer.

BRIEF DESCRIPTION OF THE DRAWINGS

The above and other objects, features and advantages of the present invention will be more apparent from the following detailed description taken in conjunction with the accompanying drawings, in which:

FIGS. 7A and 7B illustrate a structure for reducing reflection of external light in a light absorbing layer and a phase compensation layer according to an embodiment of the present invention;

DETAILED DESCRIPTION OF THE EXEMPLARY EMBODIMENTS

Figure 1:
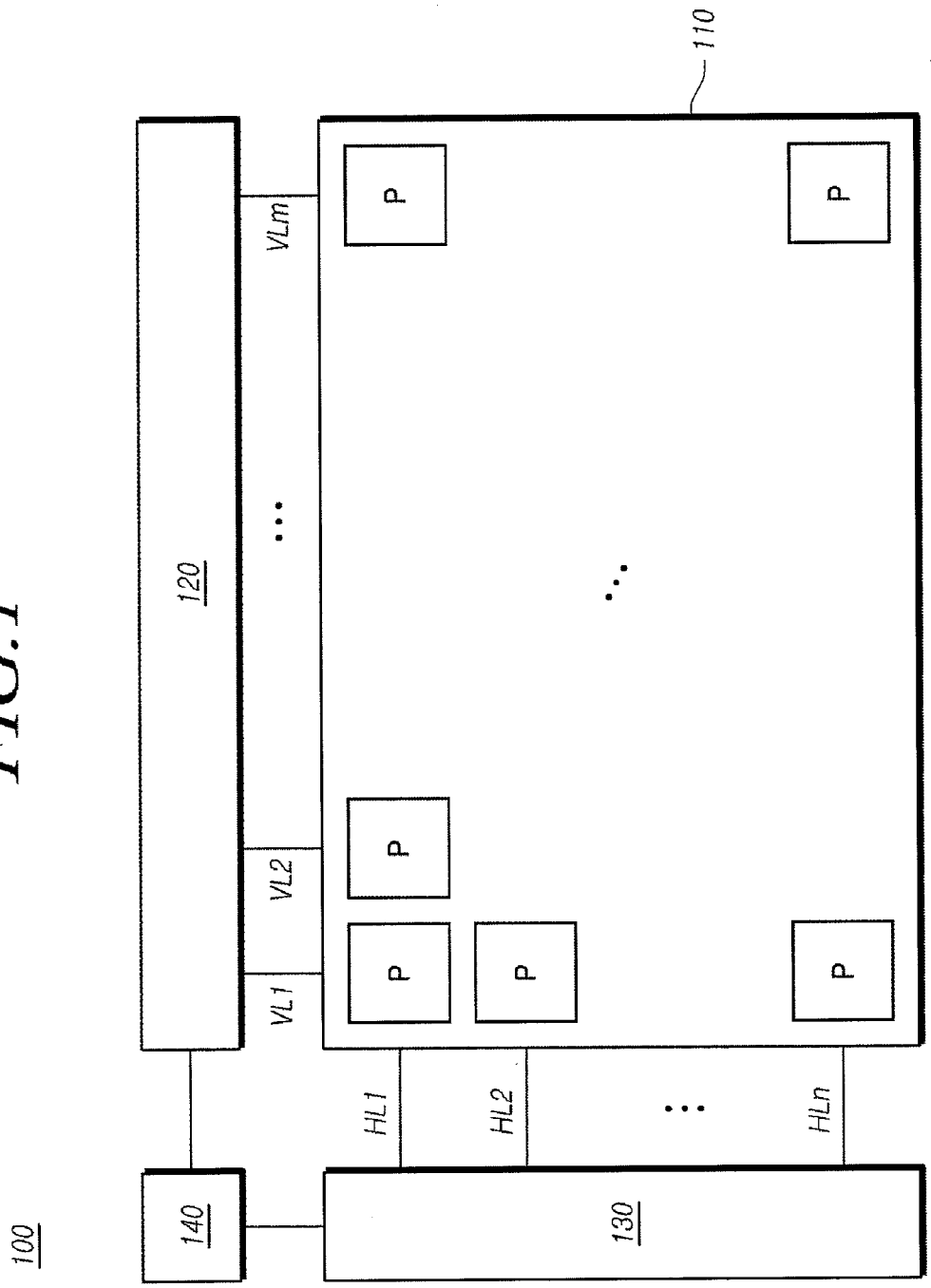
FIG. 1 schematically illustrates a display device to which embodiments of the present invention are applied.

Hereinafter, exemplary embodiments of the present invention will be described with reference to the accompanying drawings. In the following description, the same elements will be designated by the same reference numerals although they are shown in different drawings. Further, in the following description of the present invention, a detailed description of known functions and configurations incorporated herein will be omitted when it may make the subject matter of the present invention rather unclear.

In addition, terms, such as first, second, A, B, (a), (b) or the like may be used herein when describing components of the present invention. Each of these terminologies is not used to define an essence, order or sequence of a corresponding component but used merely to distinguish the corresponding component from other component(s). In the case that it is described that a certain structural element "is connected to", "is coupled to", or "is in contact with" another structural element, it should be interpreted that another structural element may "be connected to", "be coupled to", or "be in contact with" the structural elements as well as that the certain structural element is directly connected to or is in direct contact with another structural element.

FIG. 1 schematically illustrates a display device to which embodiments of the present invention are applied.

Referring to FIG. 1, the display device 100 according to an embodiment of the present invention includes a display panel 110 in which a plurality of first lines VL1 to VLm are formed in a first direction (for example, a vertical direction) and a plurality of second lines HL1 to HLn are formed in a second direction (for example, a horizontal direction), a first driving unit 120 for supplying a first signal to the plurality of first lines VL1 to VLm, a second driving unit 130 for supplying a second signal to the plurality of second lines HL1 to HLn, and a timing controller 140 for controlling the first driving unit 120 and the second driving unit 130.

In the display panel 110, a plurality of pixels P are defined by the plurality of first lines VL1 to VLm formed in the first direction (for example, a vertical direction) and the plurality of second lines HL1 to HLn formed in the second direction (for example, a horizontal direction) crossing each other.

Each of the first driving unit 120 and the second driving unit 130 may include at least one driver Integrated Circuit (IC) that outputs a signal for image display.

The plurality of first lines VL1 to VLm formed in the first direction in the display panel 100 may be, for example, data lines formed in the vertical direction (first direction), for transferring a data voltage (first signal) to vertical rows of pixels, and the first driving unit 120 may be a data driving unit for supplying a data voltage to the data lines.

The plurality of second lines HL1 to HLn formed in the second direction in the display panel 110 may be gate lines formed in the horizontal direction (second direction), for transferring a scan signal (first signal) to horizontal rows of pixels, and the second driving unit 130 may be a gate driving unit for supplying a scan signal to the gate lines.

Further, a pad unit for connection with the first driving unit 120 and the second driving unit 130 is arranged in the display panel 110. When the first driving unit 120 supplies a first signal to the plurality of first lines VL1 to VLm, the pad unit transfers the first signal to the display panel 110. In the same manner, when the second driving unit 130 supplies a second signal to the plurality of second lines HL1 to HLn, the pad unit transfers the second signal to the display panel 110. Therefore, the pad unit may be simultaneously formed in the process of forming areas of the pixels of the display panel 110.

Meanwhile, a display device using organic electrofluorescence among the display devices as shown in FIG. 1 may apply a polarizing plate or a polarizing film capable of shield reflection by each electrode unit.

Figure 2:
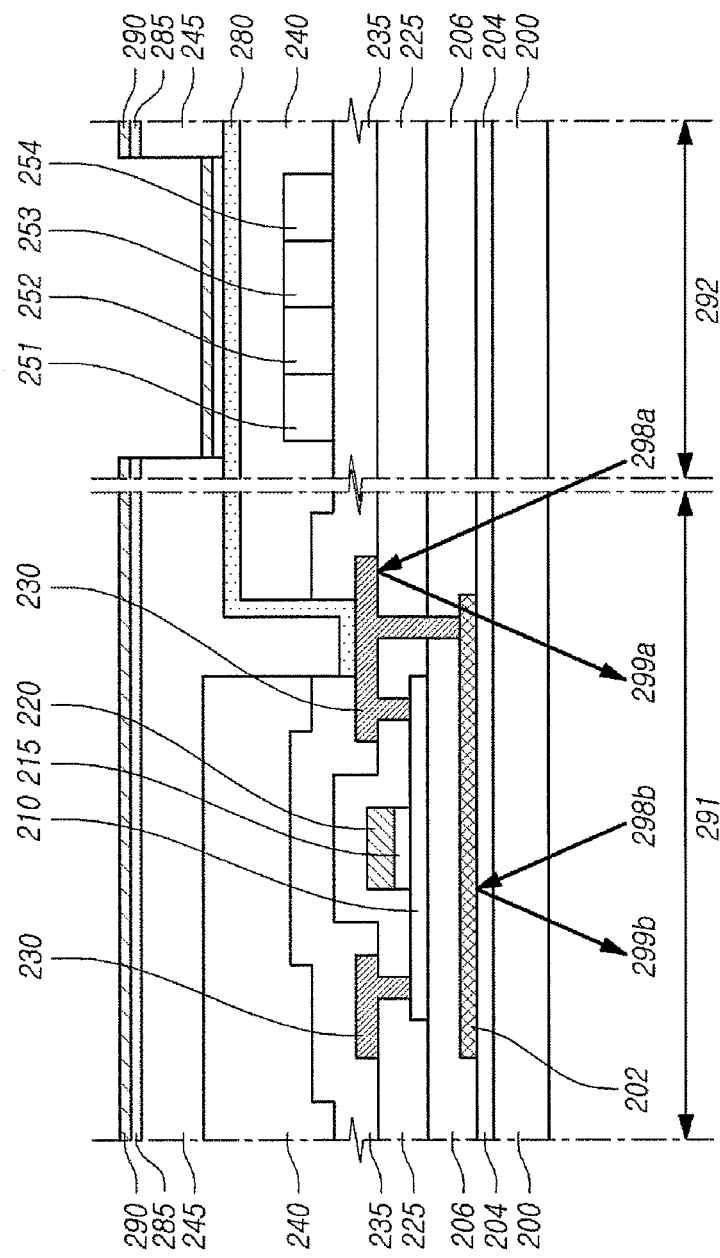
FIG. 2 illustrates a part of a display panel to which the present invention is applied.

FIG. 2 illustrates a part of a display panel to which the present invention is applied. FIG. 2 illustrates a part of a display panel in which no polarizing plate is used.

A thin-film transistor area 291 on a substrate 200 includes a light shield layer 202, buffer layers 204 and 206, an active layer 210 and a gate insulation layer 215, a gate 220, and an InterLayer Dielectic (ILD) layer 225, and the ILD layer is partially etched so that the active layer 210 is exposed, and a source/drain electrode 230 is connected thereto. Further, a passivation layer 235, an overcoat layer 240, and a bank 245 are formed. Meanwhile, a pixel area 292 has a pixel electrode 280, and an organic layer (organic light emitting layer) 285 formed therein, and is configured by a cathode electrode 290. An RGB area has red/green/blue color filters 251, 253 and 254, and a white pixel area 252 does not have a separate color filter formed therein.

In FIG. 2, although the pixel area illustrates all of four pixels for the convenience of the description, each of the four pixels can divide the organic layers 285 by a bank, and each of the pixel electrodes 280 can be connected to a thin-film transistor area on each of the RWGB areas 251, 252, 253 and 254.

In FIG. 2, a polarizing plate or a polarizing film for reducing reflection of external light (the incident light from the outside) may not be used, so that beams 298a and 298b of light introduced from the outside are reflected to paths 299a and 299b by wiring such as a source/drain electrode 230 and a light shielding layer 202.

An example of a method for reducing reflection of non-polarized external light at a metal part such as the wiring corresponds to a scheme of coating a material such as a Black Matrix (BM) to reduce reflection generated at a metal. That is, in order to form a low-reflection pattern through external light absorption, a pattern may be formed after an organic BM layer is coated, or a pattern may be formed by depositing an inorganic BM having the thickness of several microns. These schemes consume a lot of processing time, and increase manufacturing costs needed for forming the BM. Further, in a case of an organic light emitting display panel having a bottom emission structure, when a Thin-Film Transistor (TFT) is manufactured after the BM pattern, a following heat process (at a temperature of 300° C. or more) should be performed, so that there is a limitation in use of the organic BM, etc.

That is, a technology of forming a BM for reducing reflection of external light needs to secure the thickness for absorbing the external light. When the organic BM is coated to have a thickness of about 5-6 um, the reflectance of 10% or lower can be secured. Further, when an inorganic BM is coated to have a thickness of about 3-4 um, the reflectance of 10% or lower can be secured. However, a material having a heat-resisting property and a processing time are required, and when the inorganic BM is deposited, a lot of time is consumed for deposition using sputtering, so that it is difficult to secure a mass production technology of the process.

Hereinafter, in an embodiment of the present invention, examples of a material laminated on a light absorbing layer in order to reduce reflection of non-polarized external light correspond to an alloy oxide made of a metal and two or more of a copper oxide, a nickel oxide, a molybdenum oxide, or copper/nickel/molybdenum. The reflectance of external light at a metal can be reduced to 10% or lower, by depositing the aforementioned material on a light absorbing layer, or by forming a dual layered structure by using a light absorbing layer and a phase compensation layer. As an example of the phase compensation layer, a transparent oxide having a refractive index similar to that of a copper oxide may be applied, and a phase compensation layer provides an effect of further reducing the reflectance over all wavelength areas. The thickness of the light absorbing layer and the phase compensation layer according to the present invention is preferably 500 to 1000 Å, which provides a low reflection effect by improving an optical absorptivity and generating a phase-difference interference of the external light through the dual-layered structure.

Hereinafter, a display device in which a copper oxide is deposited on an area for reflecting external light, such as wiring including electrical connection lines and electrodes, which corresponds to an embodiment of a low reflective material for the aforementioned light absorbing layer, will be described. Although the copper oxide will be described in the following description, the present invention is not limited thereto, and a metal oxide which is applicable in consideration of a refractive index and an extinction coefficient can be applied to an embodiment of the present invention. Although examples in the present invention where the light absorbing layer is deposited correspond to a gate, a source electrode, a drain electrode, a light shield layer, etc., the present invention is not limited thereto, and the light absorbing layer may be disposed on all areas from which external light can be reflected.

In the present invention, low reflection of external light is achieved by removing a polarizing film or a polarizing plate and by laminating a singular metal oxide such as a copper oxide, as a light absorbing layer, on a source/drain electrode and a gate corresponding to a metal wiring of a thin-film transistor area, and a light shield area. Further, a phase compensation layer (phase-difference compensation layer) for performing a phase-difference compensation function through destructive interference may be laminated on the light absorbing layer in order to secure a lower reflectance for external light. Although SN, IGZO, ITO, etc. may constitute the phase compensation layer, the present invention is not limited thereto. In the present invention, a low reflective display panel on which the light absorbing layer is laminated and the phase compensation layer is selectively laminated will be described in detail.

Figure 3:
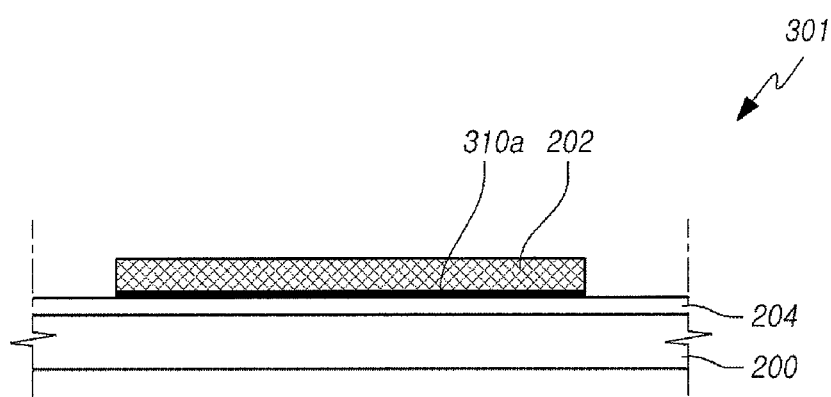
FIG. 3 illustrates a structure in which a light absorbing layer and a phase compensation layer are laminated on a light shield layer formed on a substrate according to an embodiment of the present invention.
Figure 3:
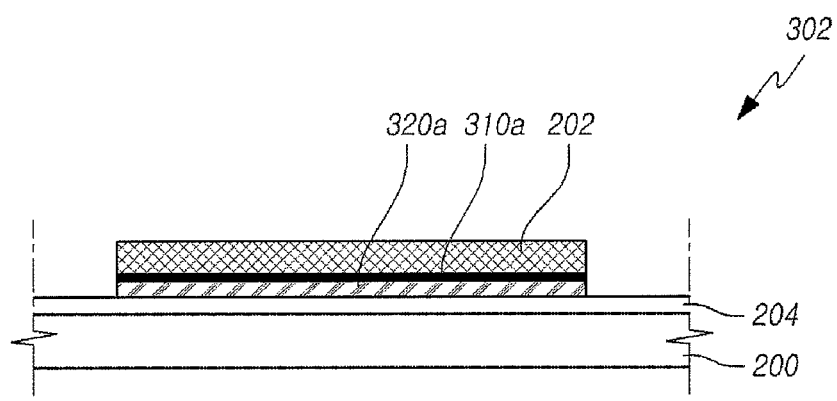

FIG. 3 illustrates a structure in which a light absorbing layer and a phase compensation layer are laminated on a light shield layer formed on a substrate according to an embodiment of the present invention. A structure of the entirety of the panel has been described in FIGS. 1 and 2, so that a part to which an embodiment of the present invention is applied will be enlarged and illustrated. An embodiment 301 corresponds to an embodiment where a light absorbing layer is formed on a light shield layer, and an embodiment 302 corresponds to an embodiment wherein a light absorbing layer and a phase compensation layer are formed as a dual layer.

In the embodiment 301, a buffer layer 204 is formed on a substrate 200, and a light absorbing layer 301a is disposed on the buffer layer 204. Further, a light shield layer 202 is disposed on a light absorbing layer 310a. In the embodiment 301, the buffer layer may be selectively formed. The light absorbing layer 301a is disposed between a light shield layer 202 and the substrate, and when a material of the light absorbing layer 310 has an excellent deposition force with respect to the substrate 200, the buffer layer 204 may not be formed. The light absorbing layer 310a absorbs external light introduced through the substrate 200, thereby reducing reflection of external light caused by the light shield layer 202 in the display panel in which a polarizing film or a polarizing plate is not formed.

The light absorbing layer 310a may be formed using a mask (photo resist) required for forming the light shield layer 202. The light absorbing layer 310a is deposited under the light shield layer 202, and in a manufacturing process, the light absorbing layer 310a is first formed using the same mask, and the light shield layer 202 may then be formed.

In the embodiment 302, the buffer layer 204 is formed on the substrate 200, and a phase compensation layer 320a is disposed on the buffer layer 204. Further, the light absorbing layer 310a and the light shield layer 204 are disposed on the phase compensation layer 320a. In the embodiment 302, the buffer layer 204 may be selectively formed. The phase compensation layer 320a is disposed between the light absorbing layer 301 and the substrate 200, and when a material of the phase compensation layer 320a has an excellent deposition force with respect to the substrate 204, the buffer layer 204 may not be formed. The phase compensation layer 320a compensates a phase of light. The light absorbing layer 310a absorbs external light introduced through the substrate 200, and the light that is not absorbed by the light absorbing layer 310a has a phase changed by the phase compensation layer 320a and passes toward the substrate 200. In this process, the light with the changed phase is canceled by the light introduced from the substrate, and consequentially the light that is not absorbed by the light absorbing layer 310a is not reflected, either.

In the embodiment 302, the light absorbing layer 310a and the phase compensation layer 320a may be formed using a mask (photo resist) needed for forming the light shield layer 202. Both the light absorbing layer 310a and the phase compensation layer 320a are deposited under the light shield layer 202, and in a manufacturing process, before forming the light shield layer 202, the phase compensation layer 320a is first formed using the same mask, the light absorbing layer 310a is formed on an area where the phase compensation layer 320a, and the light shield layer 202 is then formed.

The thickness of the phase compensation layer may be configured in proportion to the wavelength of external light and in inverse proportion to the refractive index of the light absorbing layer. The external light corresponds to a visible ray, so that in accordance with an embodiment, the thickness of the phase compensation layer may be configured in proportion to a central wavelength band in the wavelength band of the visible ray. In another embodiment, the thickness of the phase compensation layer may be configured in proportion to a specific wavelength band in consideration of the visible sense of the display panel in the wavelength band of the visible ray.

Figure 4:
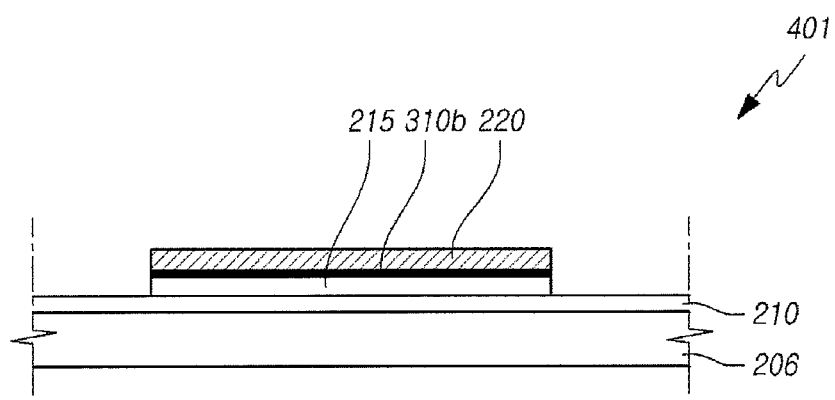
FIG. 4 illustrates a structure in which a light absorbing layer and a phase compensation layer are laminated on a gate according to an embodiment of the present invention.
Figure 4:
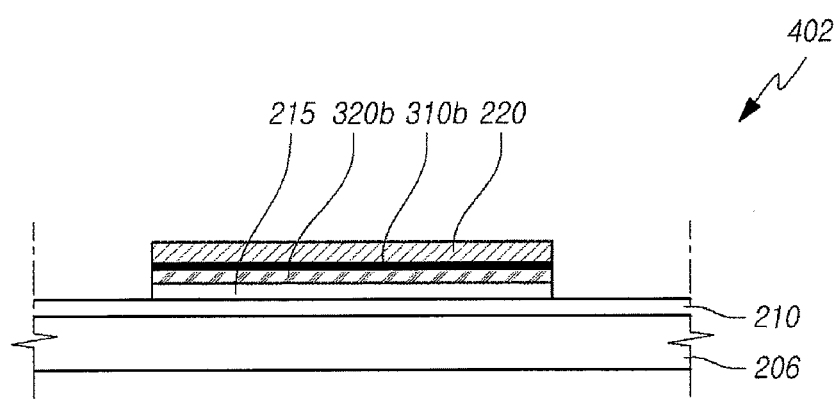

FIG. 4 illustrates a structure in which a light absorbing layer and a phase compensation layer are laminated on a gate according to an embodiment of the present invention. The entirety of the panel has been illustrated in FIGS. 1 and 2, so that a part to which an embodiment of the present invention is applied is enlarged and illustrated.

In an embodiment 401, an active layer 210 is formed on a buffer layer 206, and a gate insulation layer 215 is disposed on the active layer. Further, a light absorbing layer 310b is formed on the gate insulation layer 215. A gate 220 is disposed on the light absorbing layer 310b. In the embodiment 401, the buffer layer 206 may be selectively formed. The light absorbing layer 310b absorbs external light introduced from the outside, thereby reducing reflection of the external light by the gate 220 of the display panel in which a polarizing film or a polarizing plate is not formed.

The light absorbing layer 310b may be formed using a mask (photo resist) needed for forming the gate 220. The light absorbing layer 310b is deposited under the gate 220, and in a manufacturing process, before the gate is formed, the light absorbing layer 310 is first formed using the same mask, and the gate 220 is then formed.

In an embodiment 402, the active layer 210 is formed on the buffer layer 206, and the gate insulation layer 215 is disposed on the active layer 210. A phase compensation layer 320b and a light absorbing layer 310b are formed on the gate insulation layer 215. The gate 220 is disposed on the light absorbing layer 310b. In the embodiment 402, the buffer layer 206 may be selectively formed. The light absorbing layer 310b and the phase compensating layer 320b absorb external light introduced from the outside, thereby reducing reflection of the external light by the gate in the display panel in which a polarizing film or a polarized plate.

The phase compensation layer 320b and the light absorbing layer 310b may be formed using a mask (photo resist) needed for forming the gate 220. The light absorbing layer 310b is deposited under the gate 220, and in a manufacturing process, before the gate 220 is formed, the phase compensation layer 320b is first formed using the same mask, and the light absorbing layer 310b is formed thereon, and the gate 220 is then formed. The aforementioned phase compensation layer of FIG. 3 can be applied to the phase compensation layer of FIG. 4.

Although the gate is mainly described in FIG. 4, the gate is not limited thereto, and includes wiring simultaneously formed of a gate material together with the gate. That is, in the present invention, the gate includes the wiring formed together with the gate as well as the gate of a transistor.

Figure 5A:
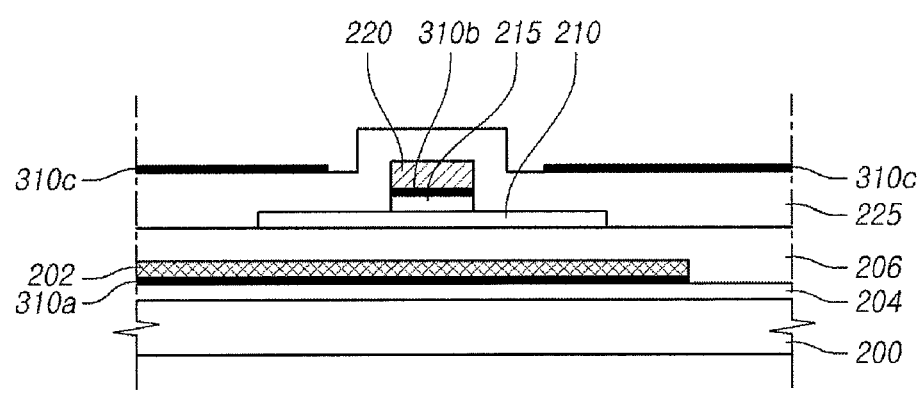
FIGS. 5A to 5C illustrate a process of laminating a light absorbing layer on a source electrode and a drain electrode, and a laminated structure, according to an embodiment of the present invention.
Figure 5B:
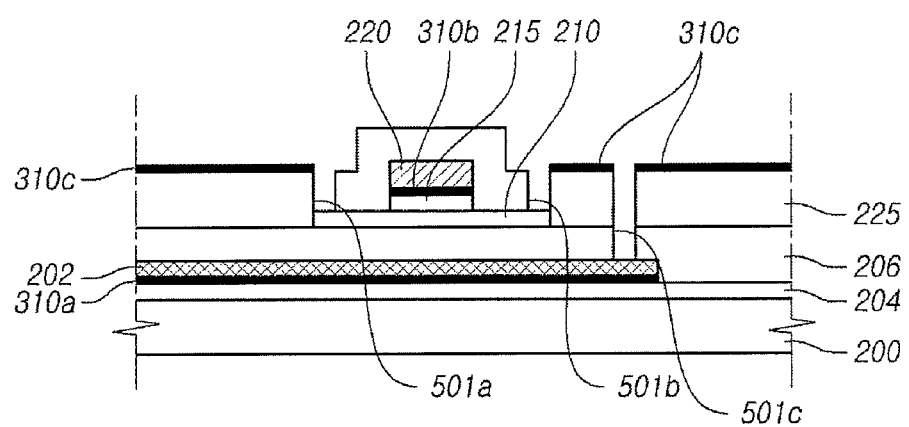
Figure 5C:
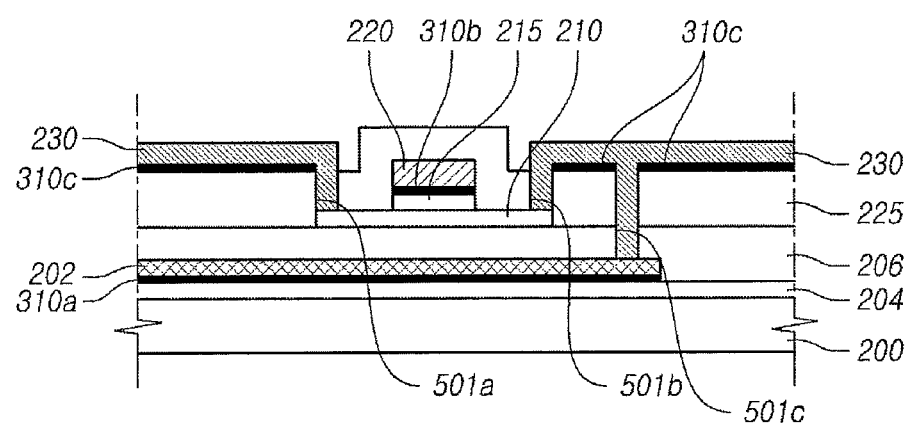

FIGS. 5A to 5C illustrates a process of laminating a light absorbing layer on a source electrode and a drain electrode and a laminated structure according to an embodiment of the present invention. The structure of the entirety of the panel has been illustrated in FIGS. 1 and 2, so that a part to which an embodiment of the present invention is applied is enlarged and described.

In FIG. 5A, after the active layer 210, the gate insulation layer 215, and the gate 220 are formed, the ILD layer 225 is formed, and a light absorbing layer 310c is formed on the ILD layer 225. When the light absorbing layer 310c is formed, a mask (photo resist) for a source electrode and a drain electrode to be later deposited may be used.

FIG. 5B is a view in which a contact hole for forming a source electrode and a drain electrode is formed. The light absorbing layer 310c, the ILD layer 225, and the buffer layer 206 are etched, and contact holes 501a, 501b and 501c are formed to expose the active layer 210 and the light shield layer 202.

FIG. 5C is a view in which a source electrode and a drain electrode (230) are formed using the same mask as that of the light absorbing layer 310c formed in FIG. 5A. The light absorbing layer 310c formed under the source electrode and the drain electrode 230 absorbs external light introduced from the outside, thereby reducing reflection of the external light by the source electrode and the drain electrode 230 in the display panel in which a polarized film or a polarized plate is not formed.

Although not illustrated in the drawings, before the light absorbing layer is formed, a phase compensation layer may be formed using the mask (photo resist) for the source electrode and the drain electrode.

Although the source and drain electrodes are mainly described in FIGS. 5A to 5C, the source electrode and the drain electrode are not limited thereto, and include all wiring formed of a material constituting the source electrode and the drain electrode together with the source and drain electrodes at the same time. That is, in the present invention, the source and drain electrodes include all the wiring simultaneously formed together with the source and drain electrodes as well as the source and drain electrodes of the transistor.

Figure 6:
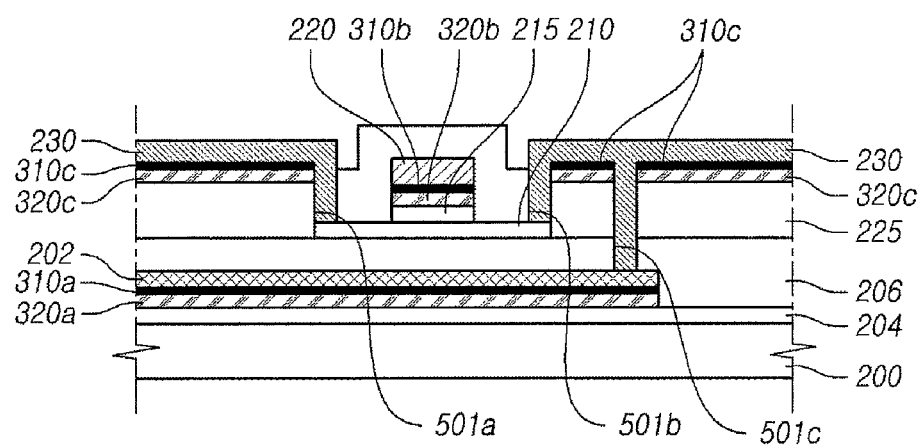
FIG. 6 illustrates a structure of a thin-film transistor on which a phase compensation layer is deposited using the process of FIGS. 5A to 5C.

FIG. 6 illustrates a structure of a thin-film transistor on which a phase compensation layer is deposited in the same manufacturing process as that of FIGS. 5A to 5C. Even in the light shield layer 202 and the gate 220, the phase compensation layers 320a and 320b are first deposited, and the light absorbing layers 310a and 310b are deposited. Also, a phase compensation layer 320c and a light absorbing layer 310c are formed under the source electrode and the drain electrode 230. The aforementioned phase compensation layer of FIG. 3 can be applied to FIG. 6.

Figure 7A:
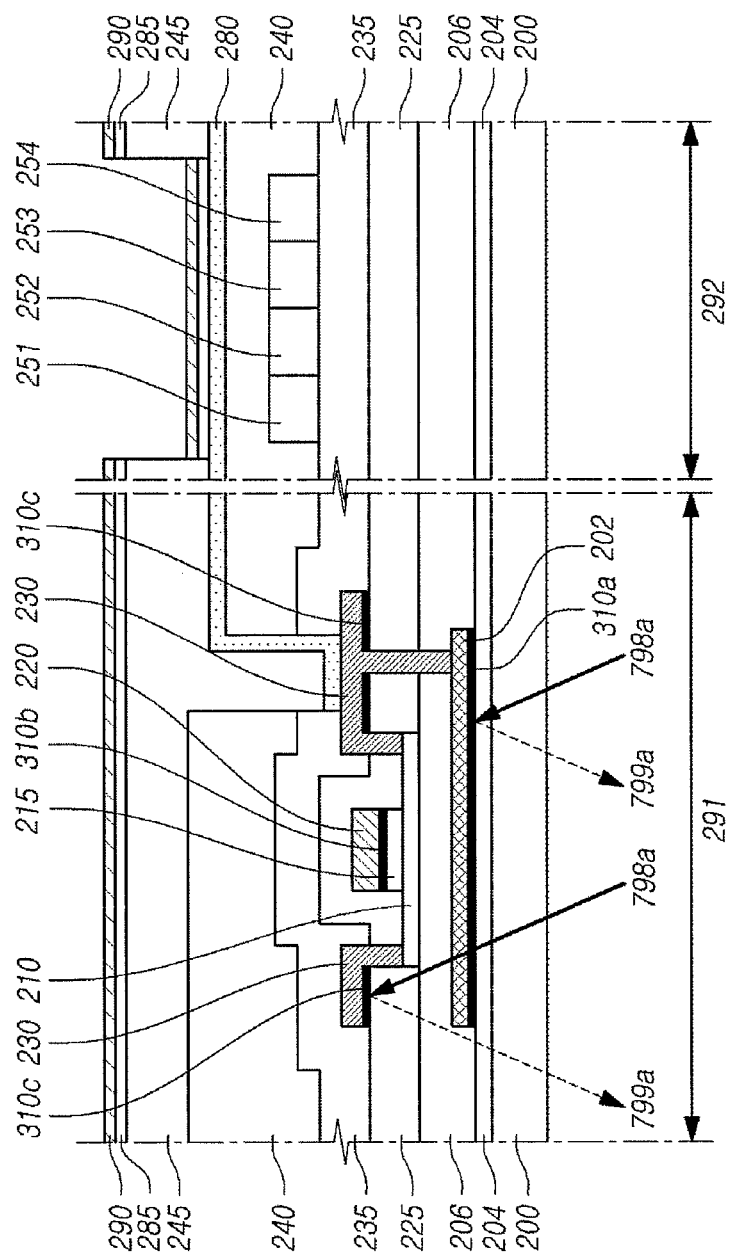

FIGS. 7A and 7B illustrate a structure for reducing reflection of external light by a light absorbing layer and a phase compensation layer according to an embodiment of the present invention. Although FIGS. 7A and 7B illustrate a structure of a low reflective OLED using a bottom emission scheme, the present invention is not limited thereto, and the structure of FIGS. 7A and 7B can be applied to panels having various structures. That is, the structure of FIGS. 7A and 7B is applicable to all panels which do not employ a polarizing film or a polarizing plate and have a characteristic in which external light is reflected by wiring.

The panel to which the structures of FIGS. 7A and 7B are applied has a plurality of data lines and a plurality of gate lines disposed therein, and includes an active layer formed by intersecting the data lines and the gate lines as a thin-film transistor area, a plurality of thin-film transistors including a gate in which a light absorbing layer is selectively disposed and a source electrode and a drain electrode in which a light absorbing layer is selectively disposed, a light shield layer in which a light absorbing layer is selectively disposed while facing the thin-film transistor, and a plurality of pixel electrodes connected to a source electrode or a drain electrode of the thin-film transistor. Further, the fact that the data driving unit and the gate driving unit for driving a data line and a gate line of the display panel are disposed within the display device has been previously described in FIG. 1. Furthermore, in FIGS. 3 to 6, the light absorbing layer selectively formed in one or more of the gate, the source electrode, the drain electrode, and the light shield layer may be formed of a metal oxide or an alloy oxide, or the phase compensation layer may be coupled to such a light absorbing layer, and the extinction coefficient of the complex reflective index of a metal or an alloy constituting the light absorbing layer may be 0.4 or more.

Here, the complex reflective index is calculated in a form of "n+ik". As a value obtained by applying the value n and the value k is larger, a material can absorb a larger quantity of light. The value k of the complex reflective index which is larger than zero implies that the material is opaque. In the present specification, when the light absorbing layer is formed of a metal oxide having the extinction coefficient k of the complex reflective index which is equal to or larger than 0.4, the reflection can be reduced by absorbing non-polarized external light. That is, the extinction coefficient of the complex reflective index is configured as being 0.4 or larger, thereby improving a low reflective effect by the reflection. In more detail, the light absorbing layer formed on the light shielding layer, the gate, the source electrode, and the drain electrode is formed of a metal, a metal oxide, or an alloy oxide, thereby not affecting electric flow while reducing the reflection of the external light. Further, the mask needed for forming the light shield layer, the gate, the source electrode, and the drain electrode is equally applied to the light absorbing layer, so that a separate mask is not used in a manufacturing process, thereby reducing a manufacturing time and manufacturing costs.

When the reflective index of a copper oxide (CuOx) according to an embodiment of the present invention is calculated, in a case where a wavelength of light is 550 nm, the value n is 2.58 and the value k is 0.59. Meanwhile, when the reflective index of a nickel oxide (NiOX) according to an embodiment of the present invention is calculated, in a case where a wavelength of light is 550 nm, the value n is 2.79, and the value k is 0.43. Further, oxides formed of an alloy of two or more of a plurality of metals, e.g., three metals of copper, nickel and molybdenum may be employed as the light absorbing layer. In this case, the light absorbing layer may be formed of an oxide alloyed with copper (Cu-Alloy oxide) or an oxide alloyed with nickel (NiMoOx). Further, the compound material having the reflective index of the alloyed material of which the value n is 2.0 or larger and the value k is 0.4 or larger is applied as the light absorbing layer, thereby improving light absorptivity.

When the present invention is applied, the light absorbing layer may be formed of a single oxide or a alloy oxide. Further, as an embodiment, a low reflective wiring can be implemented only by applying the single oxide such as copper oxide, nickel oxide and molybdenum oxide having the thickness of 1000 Å or thinner Further, an oxide may be deposited to have the thickness of 1 micro meter or thinner, and the mask used for wiring may be continuously used, thereby reducing manufacturing costs and simplifying the manufacturing process. A polarizing plate or a polarizing film is removed, thereby improving an efficiency of the panel and a lifespan of the element, and at the same time, the light absorbing layer is applied to a product requiring a low reflective wiring, thereby improving a visual sense.

In accordance with an embodiment of the present invention, when a metal oxide or an alloy oxide having the extinction coefficient k which is 0.4 or larger and selectively having the value n of the reflective index which is 2 or larger, in the complex reflective index having a form of "n+ik", is deposited, external light is refracted, thereby providing a low reflective effect. Especially, an example of metals which can be deposited for low reflection may correspond to one of copper, nickel and molybdenum, and an alloy generated by selecting two or more of them also provides a low reflective effect. These metals provide effects in that an efficiency of a heating process or a manufacturing process is improved while maintaining conductivity of wiring and an electrode, so that the light absorbing layer is maintained to have a low reflective characteristic as well as an electric characteristic of other wiring/electrodes of when a low reflective material is deposited, without damage.

In FIGS. 7A and 7B, a light penetration adjustment film 780 is additionally cemented to the substrate 200. The light penetration adjustment film 780 can adjust the penetration ratio of light to adjust the penetration ratio of light emitted from an organic element and the reflectance of external light. The light penetration adjustment film 780 can be selectively coupled to the substrate.

FIG. 7A illustrates a structure of a thin-film transistor where the aforementioned light absorbing layer 310 is disposed. Although an embodiment of FIG. 7A is that a material of light absorbing layers 310a, 310b and 310c corresponds to copper oxide, the light absorbing layers may be formed using a material having a high light absorbing efficiency and a conductivity, such as manganese, nickel, titanium, etc.

In FIG. 7A, the light absorbing layers may use a pattern to form a metal material at a location where each of them is formed, according to the corresponding location. For example, the light absorbing layer 310a disposed under the light shield layer 202 is primarily formed using a photo mask pattern for the light shield layer 202, and the light shield layer 202 is then formed on the light absorbing layer 310a by using the same mask pattern. Using the same process, the light absorbing layer 310b is primarily formed using a photo mask pattern for forming the gate 220, the gate 220 is then formed on the light absorbing layer 310b using the same mask pattern. A mask pattern for the source/drain electrode 230 is also used for patterning the light absorbing layer 310c formed under the source/drain electrode 230.

In FIG. 7A, although beams 798a and 798b of external light are introduced into the light absorbing layers 310a and 310c, only a small quantity of beams 799a and 799b of light is reflected due to physical characteristics of the light absorbing layer 310a and 310c.

FIG. 7B illustrates a structure of a thin-film transistor where the aforementioned light absorbing layer 310 and the aforementioned phase compensation layer 320 are disposed. Phase compensation layers 320a, 320b and 320c are formed under the light absorbing layers 310a, 310b and 310c, and are formed of an oxide having a high reflectance, such as SiNx, ITO, IZO, IGZO, etc. The phase compensation layers 320a, 320b and 320c may be formed to have the same aforementioned pattern as that of the light absorbing layers 310a, 310b, and 310c. That is, the phase compensation layers may use a pattern to be used to form a metal material at a location where each of them are formed, according to the corresponding location. For example, the phase compensation layer 320a disposed under the light shield layer 202 is primarily formed using a photo mask pattern for the light shield layer 202, the light absorbing layer 310a is formed using the same mask pattern, and the light shield layer 202 is formed thereon. Using the same process, the phase compensation layer 320b is primarily formed using a photo mask pattern for forming the gate 220, the light absorbing layer 310b is formed using the same mask pattern, and the gate 220 is then formed thereon. A mask pattern for the source/drain electrode 230 is also used for patterning the phase compensation layer 320c and the light absorbing layer 310c formed under the source/drain electrode 230.

In FIG. 7B, although beams 798a and 798b of light are introduced into the light absorbing layers 310a and 310c, only a very small quantity of beams 799a and 799b of light is reflected due to physical characteristics of the light absorbing layers 310a and 310c. Further, the small quantity of light also provides an effect that cancels the introduced beams 798a and 798b of light due to the phase compensation layers 320a and 320c.

The present invention may be implemented such that an oxide having a high reflectance may be used for forming the phase compensation layer, examples of the oxide having a high reflectance correspond to materials such as SiNx, ITO, IZO, IGZO, etc., and the thickness of the phase compensation layer is 1000 Å or thinner. Likewise, the present invention may be also implemented such that the thickness of the light absorbing layer is also 1000 Å or thinner and the thickness of a portion obtained by summing the phase compensation layer and the light absorbing layer is 1000 Å or thinner.

In summary, as shown in FIGS. 7A and 7B, a single oxide or an alloy oxide having a faction of a light absorption and a phase difference interference is deposited on a metal wire, thereby reducing a reflectance of external light input to a display panel in which a polarizing plate or a polarizing film is not included.

The above-mentioned light absorbing layer and the phase compensation layer according to an embodiment of the present invention reduces a reflectance of external light which is non-polarized light and removes the external light through a phase compensation. Table 1 shows a reflectance when the light absorbing layer includes a copper oxide and the phase compensation layer includes SiNx under a metal wire.

TABLE 1

| Classificaion | Edge | Center |
| --- | --- | --- |
| Average reflectance (%) | 5.1 | 4.9 |

As shown in Table 1, the reflectances of an edge portion and a center portion of a panel are 5.1% and 4.9%, respectively. It is identified that a very small part of light introduced from the outside is reflected.

The total thickness D of the light absorbing layer and the phase compensation layer may be determined by controlling as described below in order to obtain a low reflection of external light through an absorption of visible light and a phase different interference. When the total thickness is controlled as described below, the thickness which is proper for a wavelength of the external light and a characteristic of the deposited light absorbing layer may be selected, thereby improving a light absorbing efficiency and a low reflection effect.

Equation 1

$$D = \frac{\lambda}{4n} \quad (1)$$

Here, 'n' is a refractive index of the light absorbing layer. When the light absorbing layer includes a material of which a refractive index is 2.0 (i.e., n=2.0), the total thickness of the light absorbing layer for the low reflection and the phase compensation layer may be equal to or thinner than 1 μm (1000 Å) in consideration of the wavelength of the external light, the refractive index of the light absorbing layer, and the like. More specifically, in order to increase a light absorption effect, the thickness may be 500 to 1000 Å. According to Equation 1, the thickness of the phase compensation layer may be proportional to the wavelength of the external light, and inversely proportional to the refractive index of the light absorbing layer. The above-mentioned Equation 1 is for calculating an optical destructive interference for reducing a reflection when a single thin-film exists, but the present invention is not limited thereto. That is, in order to reduce a reflectance, various thicknesses may be selectively applied.

When the thicknesses of the light absorbing layer and the phase compensation layer are controlled, a light absorbing ratio for the external light and an effect of a phase compensation can be increased. This is described above with reference to FIGS. 3 to 7B.

In more detail, the reflectance according to the existence-or-not of the light absorbing layer and the phase compensation layer will be described with reference to the following Table 2.

TABLE 2

| Reflectance for each thickness of light absorbing layer and each thickness of phase compensation layer | | | |
| --- | --- | --- | --- |
| Thickness of phase compensation layer (Å) | Thickness when light absorbing layer is formed of CuOx (Å) | Thickness when light absorbing layer is formed of MoTi (Å) | Reflectance (%) |
| None | 600 | 300 | 7.5 |
| None | 500 | 300 | 7.8 |
| 400 (IGZO) | 600 | 300 | 5.4 |
| 400 (IGZO) | 500 | 300 | 5.0 |

TABLE 2-continued

| Reflectance for each thickness of light absorbing layer and each thickness of phase compensation layer | | | |
| --- | --- | --- | --- |
| Thickness of phase compensation layer (Å) | Thickness when light absorbing layer is formed of CuOx (Å) | Thickness when light absorbing layer is formed of MoTi (Å) | Reflectance (%) |
| 300 (SiNx) | 600 | 300 | 5.3 |
| 300 (SiNx) | 500 | 300 | 4.9 |

Figure 8:
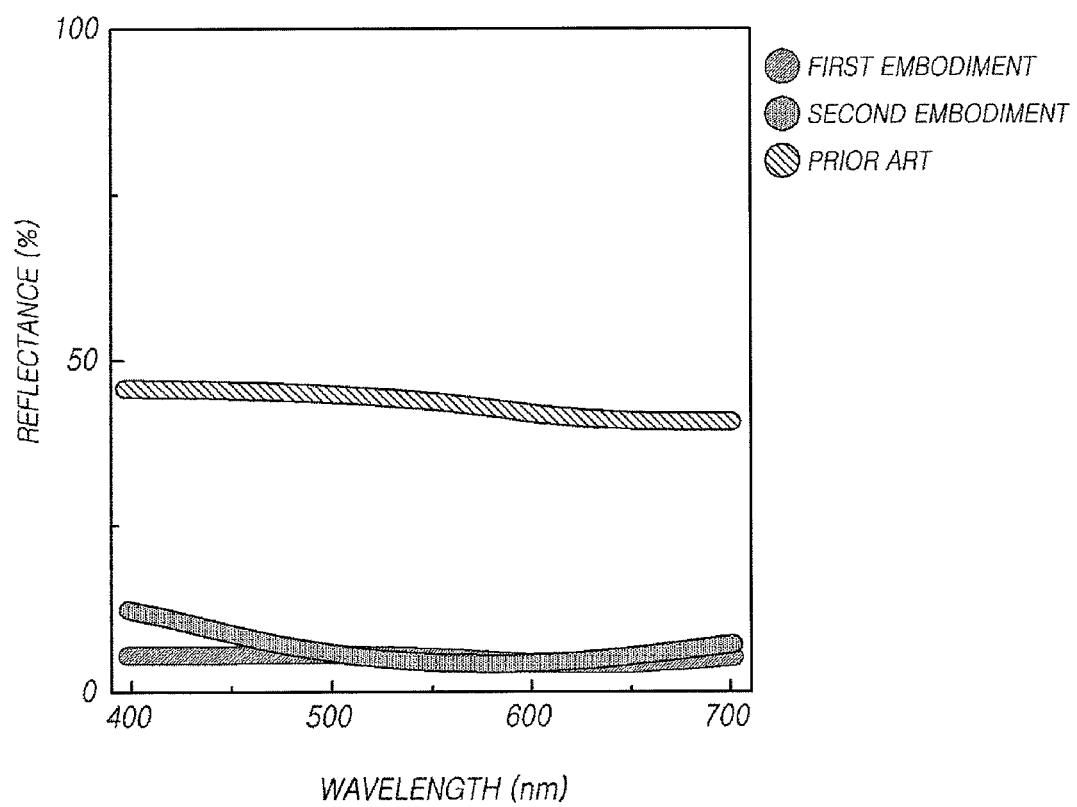
FIG. 8 is a graph depicting relationships between a reflectance and a wavelength according to an embodiment of the present invention and the related art.

FIG. 8 is a graph depicting relationships between a reflectance and a wavelength according to an embodiment of the present invention and the related art.

A first embodiment is a case wherein a light absorbing layer and a phase compensation layer are formed in a metal line. The metal line includes an alloy of Cu/MoTi, the light absorbing layer includes CuOx, and the phase compensation layer includes SiNx. A reflectance is 4.9% in all wavelength bands.

A second embodiment is a case wherein the light absorbing layer is formed in the metal line. The metal line includes an alloy of Cu/MoTi, and the light absorbing layer includes CuOx. The reflectance is somewhat high in a low wavelength band, the reflectance is equal to or lower than that of the first embodiment in 500 to 700 nm area, and an average reflectance is 6.3%.

In the prior art, a reflectance of external light is 43%. In summary, when the light absorbing layer and the phase compensation layer are selectively deposited on the metal line, the reflectance of the external light is reduced from 4.3% to 4.9%.

As described with Equation 1 and Table 2 above, the thickness of the light absorbing layer in the first and second embodiments may be set to be 1 μm or below. The thickness may be set to be 1 μm or below (i.e. equal to or thinner than 1000 Å) in consideration of a wavelength of the external light, a refractive index of the light absorbing layer, and the like. In order to increase a light absorbing effect, the thickness may be 500 to 1000 Å. This may be applied to all of the light absorbing layers according to an embodiment of the present invention described with reference to FIGS. 3 to 7B.

The display panel including the light absorbing layer described above may include a multi-layered light absorbing layer in the gate line and the data line. Multiple layers including a 1-1 metal layer for a gate and a line, and a second metal layer for the light absorbing layer may be formed as the gate line. In addition, multiple layers including a 1-2 metal layer for a source electrode, a drain electrode and a line, and a second metal layer for the light absorbing layer may be formed as the data line. That is, when the present invention is applied, the multiple layers of gate line and the data lines with which the light absorbing layer is combined form the thin-film transistor, and thus the light absorbing layer combined with the thin-film transistor and the lines can absorb external light.

In summary, the display panel according to the present invention includes multiple layers of a data line including a light absorbing layer and multiple layers of a gate line including the light absorbing layer, a plurality of thin-film transistors formed due to intersections of the data lines and the gate lines, a light shield layer facing the thin-film transistor, a plurality of pixel electrodes connected to a source electrode or a drain electrode of the thin-film transistor, and an organic light emitting layer facing the pixel electrode. The present invention provides an effect of absorbing an external light which is non-polarized light because a light absorbing layer is combined with a thin-film transistor and a line in multiple layers.

Meanwhile, the light shield layer may also include a light absorbing layer. The light shield layer may be a single layer structure including a light absorbing material, or may be a dual layer or multiple layer structure in which the light absorbing layer is combined with the light shield layer. When the light shield layer includes only the light absorbing material, a process of depositing a separate light absorbing layer may be omitted.

Figure 9:
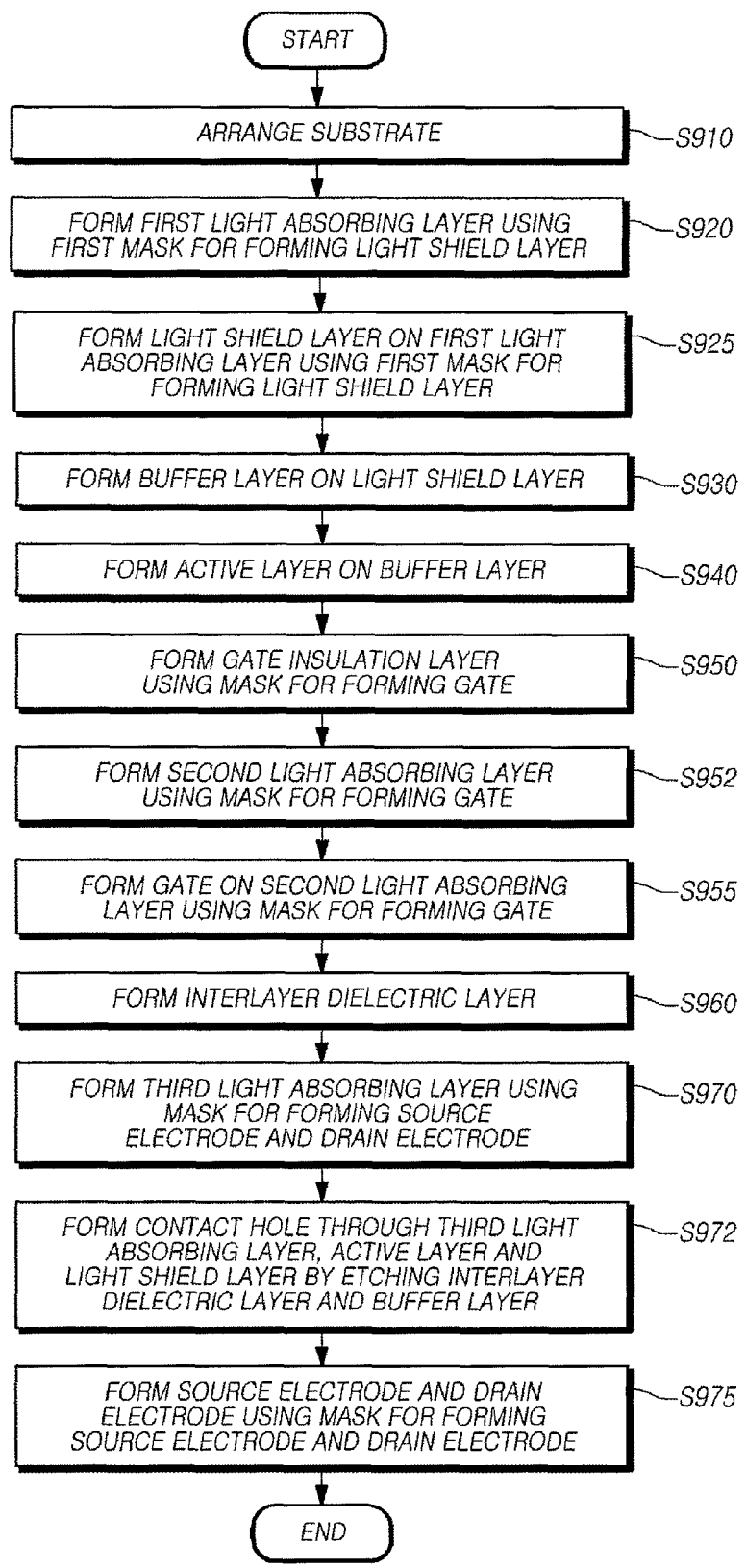
FIG. 9 is a flowchart illustrating a process of forming a light absorbing layer on a light shield layer and a wiring area according to an embodiment of the present invention.

FIG. 9 is a flowchart illustrating a process of forming a light absorbing layer on a light shield layer and a wiring area according to an embodiment of the present invention. The process of FIG. 9 may be applied to a bottom emission of FIG. 7A, but the present invention is not limited thereto, and may be applied to all processes forming a light absorbing layer for a low reflection before forming a wire layer.

Firstly, a substrate is arranged (S910). Next, a first light absorbing layer is formed using a mask (i.e., a first mask). The first light absorbing layer may be the light absorbing layer 310*a* described above. A light shield layer is formed on the first light absorbing layer using the mask (i.e. the first mask) for forming the light shield layer (S925). A buffer layer is formed (S930). An active layer is formed on the buffer layer (S940). Next, a gate insulation layer is formed using a mask (i.e. a second mask) for forming a gate (S950). Next, a second light absorbing layer is formed using the mask which is the second mask for forming the gate (S952). After the second light absorbing layer is formed, the gate is formed on the second light absorbing layer using the mask for forming the gate (S955). Next, an interlayer dielectric is formed (S960). Next, as shown in FIGS. 5A to 5C, a third light absorbing layer is formed using a mask (i.e. a third mask) for forming a source electrode and a drain electrode (S970). The third light absorbing layer, the interlayer dielectric and the buffer layer are etched, and contact holes are formed through the third light absorbing layer, the interlayer dielectric and the buffer layer (S972). Next, the source electrode and the drain electrodes are formed using the third mask for forming the source electrode and the drain electrode (S975). After the thin-film transistor is formed, processes such as connecting the thin-film transistor with a pixel electrode (i.e. an anode electrode) and forming a light emitting layer and a color filter are progressed. A protection layer is formed. A manufacturing of a panel is completed.

Although not shown in FIG. 9, a phase compensation layer may further be formed before forming the first, second and third light absorbing layers. In this case, the phase compensation layer may be deposited on each of the first, second and third light absorbing layers using the first, second and third masks. A destructive interference occurs between reflected external light and incident external light due to the phase compensation layer, thereby removing the reflected external light.

In addition, as another embodiment, a function of the phase compensation layer may be combined to the first, second and third light absorbing layers. Alternatively, the phase compensation layer and the first, second and third light absorbing layers may be formed simultaneously.

The mask which absorbs the external light is formed in each of the wire areas and metal material areas using the mask necessary in forming the light shield layer, gate, source/drain electrodes through the process of FIG. 9, thereby reducing a cost for an additional mask. In addition, the external light which is non-polarized light is absorbed, thereby reducing a cost consumed in depositing a polarizing plate and a polarizing film on a panel and increasing a light efficiency of a panel.

When the embodiment of the present invention is implemented, a low reflection metal wire can be formed and visibility of an organic light emitting display device can be improved through a process of depositing a simple metal or an alloy oxide, such as a copper oxide. Especially, a reflectance in a display panel where a polarizing plate/polarizing film for polarizing external light are not included may be determined as a combination of reflectances of an opening portion and a non-opening portion. In this case, a wire reflectance of the non-opening portion where the embodiment of the present invention is not applied is about 40%. However, when the present invention is applied, the reflectance of the non-opening portion can be reduced as described with reference to FIG. 8.

In the prior art, in order to reduce a reflectance of an external light in a metal wire area, a low reflection technique is implemented by coating a Black Matrix (BM), and this incurs a problem of forming the BM. However, when the present invention is applied, the present invention proposes a technique for implementing a low reflection in an OLED wire part using only a process of depositing a metal oxide or an alloy oxide having a thickness (500 to 1000 Å) of 1 μm or below, that is a thickness of a wavelength of visible light, thereby improving visibility of an organic light emitting display device. In addition, a polarizing plate or a polarizing film is removed, thereby improving efficiency of a display panel and a lifetime of a device.

While the technical spirit of the present invention has been exemplarily described with reference to the accompanying drawings, it will be understood by a person skilled in the art that the present invention may be varied and modified in various forms without departing from the scope of the present invention. Accordingly, the embodiments disclosed in the present invention are merely to not limit but describe the technical spirit of the present invention. Further, the scope of the technical spirit of the present invention is not limited by the embodiments. The scope of the present invention shall be construed on the basis of the accompanying claims in such a manner that all of the technical ideas included within the scope equivalent to the claims belong to the present invention.

What is claimed is:

1. A method of preparing a display device including a plurality of pixels where a plurality of gate lines cross a plurality of data lines, respectively, each of the pixels including a thin film transistor (TFT) region and a display region, the method comprising:
    forming a thin film transistor (TFT) in the TFT region; and
    forming a light emitting element for displaying images based on signals from the TFT in the display region,
    wherein a metallic layer is disposed in the TFT region for electrical connection of the TFT, and
    wherein a light absorbing layer configured to absorb at least part of light propagating toward the metallic layer is disposed on the metallic layer between the metallic layer and one of a gate insulating layer and an active layer.

2. The method of claim 1, wherein the metallic layer is a gate electrode of the TFT.

3. The method of claim 1, wherein the metallic layer is at least one of source and drain electrodes of the TFT.

4. The method of claim 1, wherein the metallic layer is a light shield layer disposed between the TFT and the light absorbing layer.

5. The method of claim 1, wherein a phase compensation layer configured to adjust a phase of the light is disposed on the light absorbing layer, and
wherein the light absorbing layer is disposed between the gate electrode and a gate insulation layer of the TFT.

6. The method of claim 1, wherein the metallic layer and the light absorbing layer are formed using a same mask.

7. The method of claim 5, wherein the metallic layer, the light absorbing layer, and the phase compensation layer are formed using a same mask.

8. A method of preparing a display device including a plurality of pixels where a plurality of gate lines cross a plurality of data lines, respectively, each of the pixels including a thin film transistor (TFT) region and a display region, the method comprising:
forming a thin film transistor (TFT) in the TFT region; and
forming a light emitting element for displaying images based on signals from the TFT in the display region,
wherein a metallic layer is disposed in the TFT region for electrical connection of the TFT,
wherein a light absorbing layer configured to absorb at least part of light propagating toward the metallic layer is disposed on the metallic layer between the metallic layer and one of a gate insulating layer and an active layer, and
wherein the metallic layer and the light absorbing layer are formed using a same mask pattern.

9. The method of claim 8, wherein the metallic layer is one of a gate electrode of the TFT, and a light shield layer disposed between the TFT and the light absorbing layer.

10. The method of claim 8, wherein the metallic layer is at least one of source and drain electrodes of the TFT, or is an electric connection wire or electrode of the TFT.

11. The method of claim 8, wherein the metallic layer is a light shield layer disposed between the TFT and the light absorbing layer.

12. The method of claim 8, further comprising a phase compensation layer configured to adjust a phase of the light propagating toward the metallic layer and disposed on the light absorbing layer.

13. The method of claim 8, wherein the light absorbing layer includes two or more of a copper oxide, a nickel oxide, a molybdenum oxide, and copper/nickel/molybdenum.

14. The method of claim 12, wherein the phase compensation layer includes at least one of SiN, IGZO, and ITO.

15. The method of claim 12, wherein the metallic layer, the light absorbing layer, and the phase compensation layer are formed using a same mask.

16. A method of preparing a display device including a plurality of pixels where a plurality of gate lines cross a plurality of data lines, respectively, each of the pixels including a thin film transistor (TFT) region and a display region, the method comprising:
forming a thin film transistor (TFT) in the TFT region; and
forming a light emitting element for displaying images based on signals from the TFT in the display region,
wherein a metallic layer is disposed in the TFT region for electrical connection of the TFT,
wherein a light absorbing layer configured to absorb at least part of light propagating toward the metallic layer is disposed on the metallic layer between the metallic layer and one of a gate insulating layer and an active layer, and
wherein a phase compensation layer is configured to adjust a phase of the light propagating toward the metallic layer and disposed on the light absorbing layer.

17. The method of claim 16, wherein the metallic layer is a gate electrode of the TFT, at least one of source and drain electrodes of the TFT, or a light shield layer disposed between the TFT and the light absorbing layer.

18. The method of claim 16, wherein the phase compensation layer includes at least one of SiN, IGZO, and ITO.

19. The method of claim 18, wherein a thickness of the phase compensation layer is proportional to a wavelength of the light and is inversely proportional to a refractive index of the light absorbing layer.

20. The method of claim 16, wherein the metallic layer, the light absorbing layer, and the phase compensation layer are formed using a same mask.

* * * * *